United States Patent [19]
Klein, Jr. et al.

[11] 3,975,705
[45] Aug. 17, 1976

[54] COLOR DISPLAY OF GEOPHYSICAL AND OTHER DATA

[75] Inventors: Emmett J. Klein, Jr.; Clyde W. Hubbard, Jr., both of Houston, Tex.; Lloyd R. Chapman, Sevenoaks, Kent, England

[73] Assignee: Seiscom Delta Inc.

[22] Filed: Mar. 6, 1975

[21] Appl. No.: 555,847

Related U.S. Application Data
[62] Division of Ser. No. 441,012, Feb. 11, 1974.

[52] U.S. Cl. ............... 340/15.5 DS; 346/33 C; 343/5 CD; 178/15
[51] Int. Cl.² ................................. G01V 1/34
[58] Field of Search .......... 340/5 MP, 15.5 DS; 346/33 C, 107 SC; 355/2; 96/27 R; 178/7.4, 15; 343/5 CP

[56] References Cited
UNITED STATES PATENTS

| | | | |
|---|---|---|---|
| 3,288,607 | 11/1966 | Middleton | 96/27 R |
| 3,649,268 | 3/1972 | Chu et al. | 96/27 R |
| 3,688,655 | 9/1972 | Klostermann et al. | 96/27 R |
| 3,781,785 | 12/1973 | Balch | 340/15.5 DS |

OTHER PUBLICATIONS

Balch, "Color Sonagrams: A New Dimension in Seismic Data Interpretation", 12/71, pp. 1074–1098, Geophysics, vol. 36, No. 6.

Grossling, "Color Mimicry in Geology and Geophysics", 4/69, pp. 249–254, Geophysics, vol. 34, No. 2.

*Primary Examiner*—Nelson Moskowitz
*Attorney, Agent, or Firm*—Pravel & Wilson

[57] ABSTRACT

A new and improved color display of geophysical and other scientific and industrial or similar technological data readily and quickly obtained from input data and containing color indications of variables in the data in a form better adapted for interpretation by analysts.

4 Claims, 8 Drawing Figures

COLOR DISPLAY OF GEOPHYSICAL AND OTHER DATA

This is a division of application Ser. No. 441,012, filed Feb. 11, 1974.

BACKGROUND OF THE INVENTION

1. Field of the Invention

The present invention relates to color displays of geophysical data and other scientific and industrial data.

2. Description of the Prior Art

Prior art attempts to display geophysical data in color have been based on complex, special purpose equipment adapted for use with specifically processed input signals expressing a particular geophysical or seismic variable, normally the frequency of the seismic signals. The displays so formed in these prior art equipment were often quite different in format, scale and appearance from typical black-and-white seismic sections, reducing their effectiveness for use in conjunction with the conventional black-and-white sections in geophysical analysis.

Other prior art color processing techniques, such as half-tone processing, did not readily adapt themselves to geophysical displays, since an initial or input color display was required as a starting point for processing. From this initial color display, plural half-tone prints were made and processed in order to form an output color display. Since half-tone processing required that a completed color display be provided to make additional color copies of the original, the effectiveness and intelligibility of half-tone processing was dependent on that of the input or original color display.

SUMMARY OF THE INVENTION

Briefly, the present invention provides a new and improved method and apparatus for color displays of geophysical and other data. In forming the color display of data, a positive image whose density varies according to the data is formed. A polymer coating is then deposited onto a display surface according to the density level or opacity of the positive image. Toner of a particular color is then applied to adhere to the polymer coating so that a color display of the data is formed.

Where numerical values of functions in the data are represented as various colors, plural positive images are formed, each varying in density according to the presence of assigned numerical values of functions in the data. A polymer coating is deposited on the display surface for a first image and toner of a first color is applied to adhere to this coating. Further polymer coatings and colors of toner are applied successively over the initial toner and subsequently applied toners to form the various colors.

In the apparatus of the present invention, the data is plotted onto a film transparency, from which a positive image is formed whose density level or opacity varies according to the data. A polymer coating is then deposited on a display surface according to the opacity of the positive image so that a color toner may be applied to form a color display of the data. Where numerical values of functions in the data are represented as various colors, plural positive images are formed, and polymer emulsions are sequentially laminated onto the display surface so that plural polymer coatings may be deposited. Color toners are sequentially applied after each polymer coating is deposited and before the next polymer emulsion is laminated thereon.

The apparatus of the present invention further includes a new and improved printer wherein the polymer coatings are exposed to ultraviolet light while the positive image screens the ultraviolet light to control the amount of polymer coatings deposited. The ultraviolet light is further angle screened for each polymer coating to be exposed so that the coatings do not form interference patterns with each other.

It is an object of the present invention to provide a new and improved method of forming a color display of data, both geophysical data and other types of technological data.

It is an object of the present invention to provide a new and improved apparatus for forming color displays of geophysical data and other types of technological data.

It is an object of the present invention to provide a new and improved printer for depositing polymer coatings to represent various colors in geophysical and other types of technological data.

DESCRIPTION OF THE PREFERRED EMBODIMENT

Figure 1:
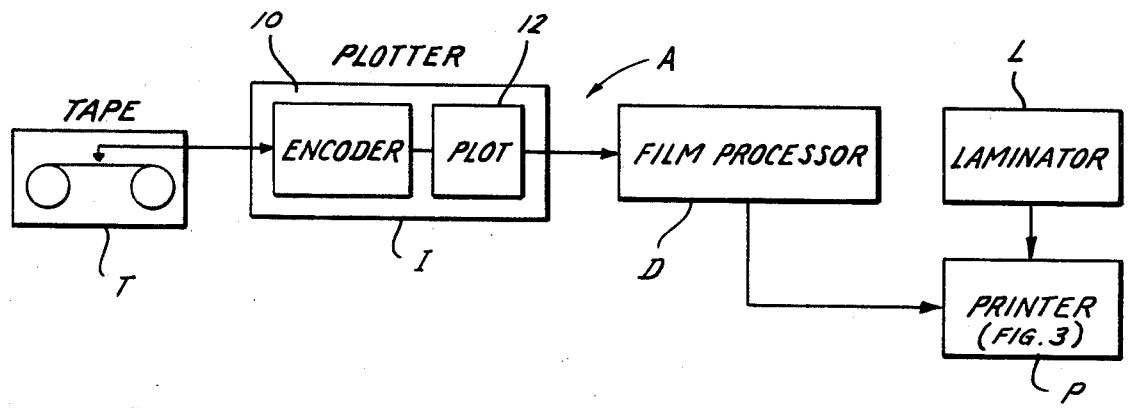
FIG. 1 is a schematic diagram of the apparatus of the present invention.

In the drawings, the letter A designates generally the apparatus of the present invention for forming a color display of data. The apparatus A (FIG. 1) is particularly adapted for forming a color display of geophysical data wherein geophysical variables are plotted as functions of seismic signal travel time. It should be understood, however, that the apparatus A of the present invention is equally adapted for forming displays of scientific, medical, industrial and other types of technological data as color functions or modulations of a common variable.

The apparatus A includes an image forming plotter I which receives electrical signals representing the data to be plotted from a tape recorder T, or from some other suitable digital memory or signal storage apparatus. The plotter I encodes the data from the tape recorder T and plots the data as a positive image from which the display is to be formed onto a film transparency.

A developer/film processor D develops the positive image of the data plotted on the film transparency by the plotter I. The positive image so developed varies in density level or opacity according to the values of geophysical data.

A display backing of paper, bristolboard, pasteboard or other suitable material has a polymer emulsion coating laminated thereover in a laminator L. After lamination, the positive image is mounted on the display backing over the polymer emulsion coating laminated thereto, and is processed in a printer P so that a polymer coating is deposited on the display surface according to the density of the positive image. Color toner dust may then be applied to adhere to the polymer coating and form a color display of the data.

The reel of tape in the storage T contains the data to be formed into the display in the apparatus A. As set forth above, geophysical data, both in the form of seismic sections and well bore logs, topographic contours, medical data and other types of technical and technological data are suitable for display in accordance with the present invention.

As an example, the data on the reel of tape in the storage T may be seismic signals processed in a conventional data processing machine such as a computer to form coded values representing various colors in a color display of an auxiliary seismic variable which is to be superimposed on a black-and-white seismic section. Suitable auxiliary seismic variables are interval velocity, reflection strength, coherence, cross-dip, any of which can be compared against a threshold level prior to display with only those variables exceeding the threshold level being displayed, or an auxiliary variable as discriminated by a second auxiliary variable, e.g., reflection strength as discriminated by signal coherence. Processing techniques to obtain data of this form of seismic variables are set forth in copending U.S. patent application Ser. No. 300,718, filed Oct. 25, 1972 and its related allowed divisional application Ser. No. 580,437 filed May 22, 1975, each assigned to the assignee of the present invention.

The processing results of this form are plural signals in a suitable signal sequence, one signal in the form of digital data representing the conventional black-and-white seismic section, and three signals representing the density values of the three component colors: magenta, cyan and yellow. These component colors when combined form the colors in the auxiliary seismic variable display superimposed as a color modulation on the black-and-white seismic section, together with a calibrated color key presenting the colors assigned to the numerical values of the variable for ease in analysis of the data. Suitable density values and techniques for processing signals to determine numerical values of the auxiliary variable for display are set forth in the copending application Ser. No. 300,718 referred to above. The black-and-white signal and the three color component density values in the other three signals are then stored in the reel of the tape storage T.

The data in the reel in the storage T containing the signals to be displayed is then furnished to the plotter I. The plotter I is a conventional signal plotter, such as an Optronics Plotter Model P-1500. The plotter I includes a tape reader which reads the signals from the reel in the storage T and furnishes such signals to a Digital-To-Analog converter or encoder 10. The encoder 10 receives the digital signals from the tape T and converts each digital signal to an analog signal amplitude. The encoded analog signal amplitudes from the encoder 10 are then furnished to an image plotter 12 which plots the signals received from the encoder 10 for each signal in the tape storage T onto a separate film transparency. The information content of the signals plotted by the plotter 12 is in the form of positive images, or positives, which when developed in the processor D vary in density level or opacity from black through shades of gray to transparent in accordance with the amplitude of the signal level output of the encoder 10 for the particular portion of the data being displayed.

The image forming plotter I thus forms an image onto a separate film transparency for each of the signals in the tape T, one for the black-and-white seismic signal, one for the magenta density level of the auxiliary seismic variable, one for the cyan density level of the auxiliary seismic variable, and one for the yellow density level of the auxiliary seismic variable being displayed.

The film transparencies containing the positive images formed in the plotter I are then developed in a developer D. As set forth above, the positive images vary in density level or opacity from black through shades of gray to transparent according to the amplitude of the signal level output of the encoder 10. The density levels so represented indicate the signal amplitude of the black-and-white seismic section, the density level of the magenta component of the color representation of the auxiliary seismic variable, the density level of the cyan color component of the color representation of the auxiliary seismic variable, and the density level of the yellow component of the color representation of the auxiliary seismic variable.

A sheet of photopolymer laminate is then laminated to a display backing in a laminator L. A suitable photopolymer laminate is a film formed from a polyester base with a light-sensitive coating applied thereto, both of which are sandwiched between and protected by upper and lower cover sheets of a suitable plastic. A suitable type of photopolymer laminate in this category is that film sold by DuPont under its trademark "Cromalin," although other suitable laminates may be used, if desired. A suitable laminator L is the Model 2700 laminator sold as part of the "Cromalin" system by DuPont, which stores a reel of the photopolymer laminate therein. As the display backing is moved past a laminating head therein, the laminator L removes the lower cover sheet from the laminate and applies the polyester base of the laminate to the display backing.

The display backing with the applied laminate and a first film transparency output of the processor D mounted thereon are then inserted in the printer P so that a polymer coating may be deposited onto the display backing according to the density of the positive image on the film transparency, in a manner set forth below.

After the polymer coating is deposited on the backing in the printer P, the display backing and the transparency are removed from the printer P and the upper cover sheet of the laminate is removed, leaving a gummy polyester coating deposited onto areas of the backing in accordance with the density of the film transparency. Where the film transparency is transparent, no gummy polyester coating is present. Color toner of a first color is then applied by hand or by suitable automatic means to adhere to the gummy areas. In this manner, a first toner color is applied in accordance with the density of a first transparent image of the data to be displayed. As has been set forth above, the density of the transparent image varies in accordance with the amplitude of the input signal from the tape T.

Figure 3:
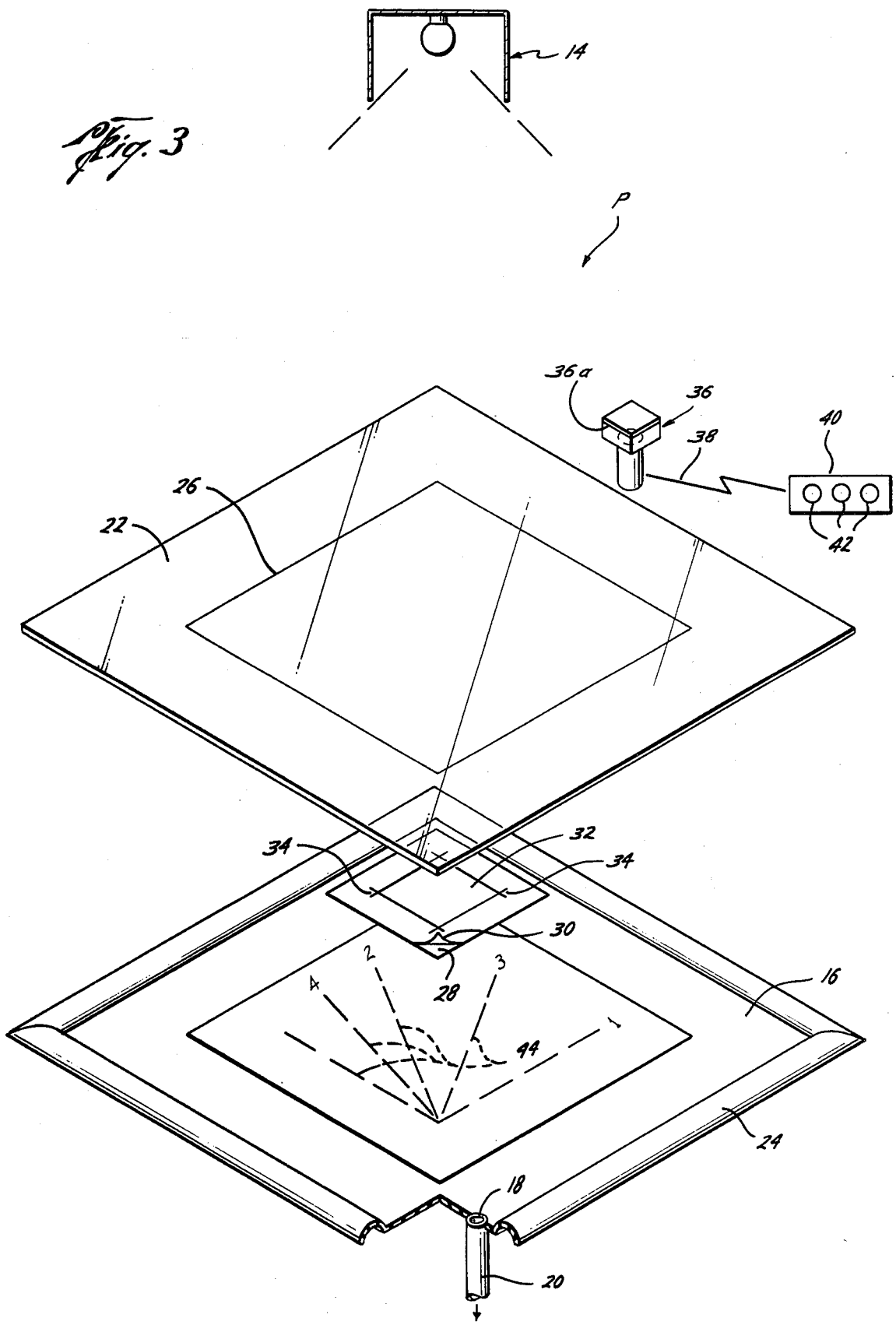
FIG. 3 is an exploded isometric schematic drawing, taken partly in cross-section, of the printer of the present invention.

Considering the printer P (FIG. 3) more in detail, a vacuum printer, such as a Berkley-Ascor vacuum printer, where a photopolymer laminate is exposed to ultraviolet light from an ultraviolet lamp or source 14 in the presence of a substantial vacuum condition, is modified in structure with the present invention in the manner to be set forth below. Conventional portions of the printer are not shown in the drawings in order to preserve clarity therein.

A base 16 of rubber or other suitable resilient material is mounted in a suitable housing in the printer P. One or more suitable apertures 18, preferably plural perforations are formed in the base 16 so that a pipe or tubing 20 connected to a pump may permit air to be withdrawn to form a vacuum between the base 16 and a transparent cover sheet 22. The cover sheet 22 is formed from glass or other suitable material and serves in conjunction with the base 16 to hold the display backing in place during illumination by the source 14. A resilient rib or rim 24 is formed about the outer edge of the base 16 and is adapted to yield downwardly when engaged by the outer edges of the cover sheet 22, permitting the cover sheet 22 and the base 16 to move towards each other when the vacuum condition is formed therebetween by means of extraction of air through the apertures 18.

The cover sheet 22 is hingedly or otherwise movably mounted with respect to the base 16 to permit insertion and removal of the polymer coated display surface, and to permit closure of the cover sheet 22 against the rim 24 during evacuation of the air between the sheet 22 and the base 16.

An optical screen 26, such as a commercially available elliptical dot screen or other commercially available optical screen is mounted or attached by suitable adhesives, on an opposite side of the cover 22 from the ultraviolet source 14. The elliptical dot screen 26 forms a grid pattern of dots which forms a mesh or group of dot openings superimposed above the deposited image in order that the entire area of the dark or gray portions of the positive image are not transferred to the photosensitive polymer coating, but rather a group of dots whose area of coverage varies in accordance with the presence or absence of gray or dark areas on the positive image.

As set forth above, a display backing is used to receive the photo polymer laminates to be applied. A display backing 28 (FIG. 3) on which the display is to be formed has a polymer emulsion 30 laminated thereto in the laminator L (FIG. 1). A corner of the emulsion 30 is raised in the drawings to schematically indicate the two separate layers, although in practice the emulsion is laminated over the entire surface of the backing 28.

A film transparency 32 is mounted on the laminated backing 28 above the emulsion 30. Suitable registry lines or guides 34 may be formed onto the display backing 28 in order to insure positioning of the transparency 32 in the proper place thereon.

A photosensitive cell 36 with a filter 36a adapted to screen out light outside the sensitivity range of the photopolymer emulsion is mounted in position to receive a portion of the output of the ultraviolet source 14 to measure the illumination output thereof. The photosensitive cell 36 sends an electrical signal over an electrical conductor 38 indicating the illumination output of the source 14 to a light-time integrator 40. A suitable light-time integrator, for example, is Graphic Arts Manufacturing Light-Time Integrator Model LI-102. The integrator 40 integrates or totals the illumination output of the source 14 as exposure time elapses so that the total illumination output of the source 14 over a time interval is measured.

Plural control knobs 42 are mounted with the integrator 40 to provide an input indication of the desired illumination-time product output of the source 14. When this desired illumination-time output product is sensed by the integrator 40, a suitable switch electrically de-energizes the printer by disabling the operating switch thereof, turning off the ultraviolet light source 14.

The light-time integrator 40 permits control of the uniformity of the density of the polymer coatings deposited from the laminate 30 onto the display backing 28 according to the data content of the transparency 32 despite fluctuations in light output intensity of the source 14. With a desired light-time product established at the input knobs 42, the light-time integrator 40 prolongs exposure time should ultraviolet light intensity from the source 14 decrease during exposure of a laminate onto the backing 28. Conversely, the integrator 40 decreases exposure time should the output intensity of the source 14 increase during exposure of a laminate onto the backing 28.

An alignment guide 44 of plural registry lines and a number indicating the sequence in which they are used is mounted with the base 16 to indicate the desired position of the display backing for each of the plural positive images to be deposited thereon. The four desired positions of alignment for the backing 28 with respect to the screen 26 during exposure of such image to the ultraviolet light from the source 14 are different. Moving the backing 28 to different positions with respect to the screen 26 in the manner indicated by the alignment guide 44 permits the screen 26 to perform the function of angle screening the ultraviolet light which prevents the superimposition of positive images during exposure and thereby prevents formation of undesirable interference patterns known as moire patterns which would reduce the intelligibility and accuracy of the display formed in accordance with the present invention.

Figure 2:
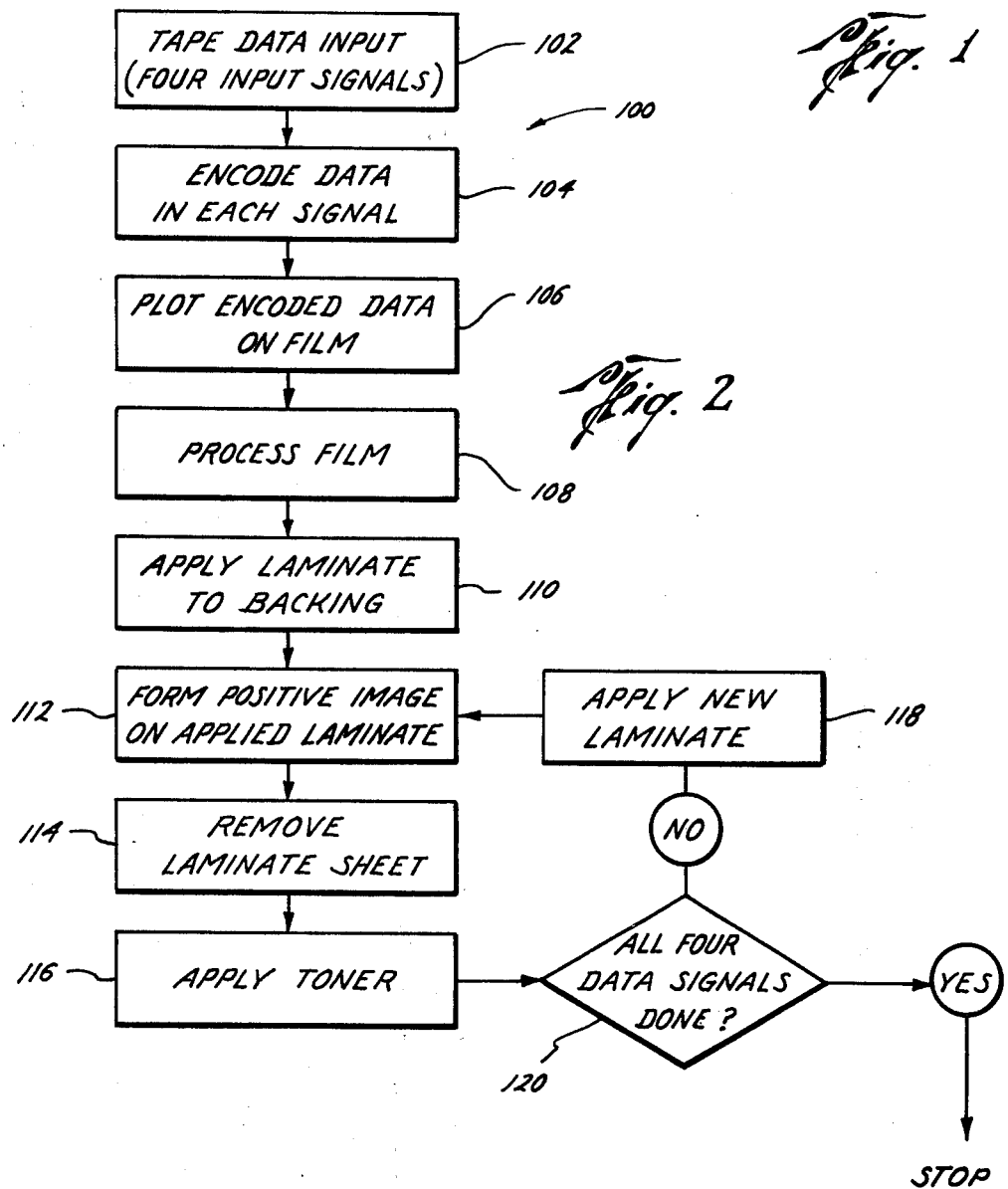
FIG. 2 is a schematic diagram of the process steps of the present invention.

Schematic diagram 100 (FIG. 2) sets forth the sequence of processing steps in order to form the input data into an output display.

A first step 102 is performed by reading in the signals of the input digital data to be displayed from the tape T into the plotter I (FIG. 1). A step 104 schematically represents the coding step where the input digital data from the tape T is converted into analog form by the encoder 10 of the plotter I. A step 106 represents the operation of the plotter 12 of the image forming plotter I where the analog data output of the encoder 10 is plotted for each of the input signals as a positive image onto separate film transparencies.

A step 108 indicates schematically the operation of the film processor D where each of the positive images formed onto film transparencies during step 106 is developed by the film processor D.

A first laminate 30 (FIG. 3) is laminated to the backing 28 in the laminator L during a step 110, and a first of the positive images formed during performance step 108 is placed thereon in registry with the registry lines 34. It is to be noted that although the positive image is superimposed on the laminate, there is no adhesive or other connection therebetween, for reasons to be set forth below. The laminated backing 28 and the superimposed positive image are then placed on the first registry line (labelled "1") in the alignment guide 44 (FIG. 3) in the printer P. A step 112 is the next step, where the positive image is formed on the applied laminate in a manner to be set forth below.

The cover plate 22 of the printer P is then moved into engagement with the rib 24 about the base 16, and appropriate settings on the knobs 42 of the light-time integrator 40 are made. The printer P is then energized, activating the ultraviolet source 14.

In the printer P, the ultraviolet light from the source 14 hardens areas of the polymer emulsion in the laminate 30 which are exposed thereto during the step 112. Where because of the data content of the input signal there are black or gray areas on the positive image 32 interposed between the laminate 30 and the ultraviolet source 14, the ultraviolet light from the source 14 does not harden the polymer emulsion in the coating, thereby leaving a gummy or sticky area on the display backing 28. The amount of area of the display backing 28 to which the coating of adhesive emulsion adheres is controlled by the extent of the input signal being plotted across the data field to be plotted.

The ultraviolet light passing through the openings in the screen 26 thus leaves a plurality of correspondingly shaped small dots or areas in those areas where the adhesive emulsion does not harden during exposure. The amount of emulsion deposited as these small dots on the backing 28 in a particular area is governed by the amplitude of the input data signal, which varies the positive image 32 in opacity or density level from black through gray to transparent, as has been set forth above. Accordingly, in areas of the display where the numerical values of the input data signal to be displayed are high, and a corresponding dark image is formed on the positive image film transparency 32, corresponding dense groupings of these small dots of emulsion are left. In areas of the display where the signal to be displayed has low numerical values, a correspondingly lighter image is formed on the transparency 32, and a correspondingly thinner or less dense grouping of dots emulsion is left on the backing 28.

When the light-time integrator 40 senses that sufficient exposure of the laminate 30 to the ultraviolet light from the source 14 has occurred as established by the settings on control knobs 42, the printer P is stopped, and the display backing 28 removed therefrom. The positive image 32 is removed from the laminated display backing 28, and is placed in storage so that it is available for subsequent use. It is important to note that display formation in accordance with the present invention does not alter the positive image film transparencies and thus the film transparencies are available for formation of subsequent displays without requiring operation of the plotter I or the developer D.

The upper cover sheet of the photopolymer laminate 30 is then removed, for example by hand, from the display backing 28 during the step 114, and the adhesive emulsion coatings deposited on the backing 28 during the step 112 are thus exposed. During the step 116 a conventional color toner dust of a first color is applied to the display backing 28 by hand or by some suitable automated means.

The color toner dust applied during the step 116 adheres only to those adhesive portions of the display backing 28 where the gummy areas of emulsion have been deposited during performance of step 112 according to the dark or gray areas present on the positive image. As has been set forth, the amount of emulsion deposited on the backing is controlled by the darkness of the positive image across areas of the display. Where large deposits of emulsion are present, relatively large amounts of toner adhere. Where lesser deposits of emulsion are present, relatively small amounts of toner adhere.

The particular number of color toners used in the present invention, as well as the particular colors or color mixtures used, and the sequence in which they are used, varies according to the type of data to be displayed. For seismic cross-section displays with a superimposed auxiliary seismic variable in color therewith, of the type set forth above, four toners are suitable for use: magenta, cyan, yellow and black.

Figure 4A:
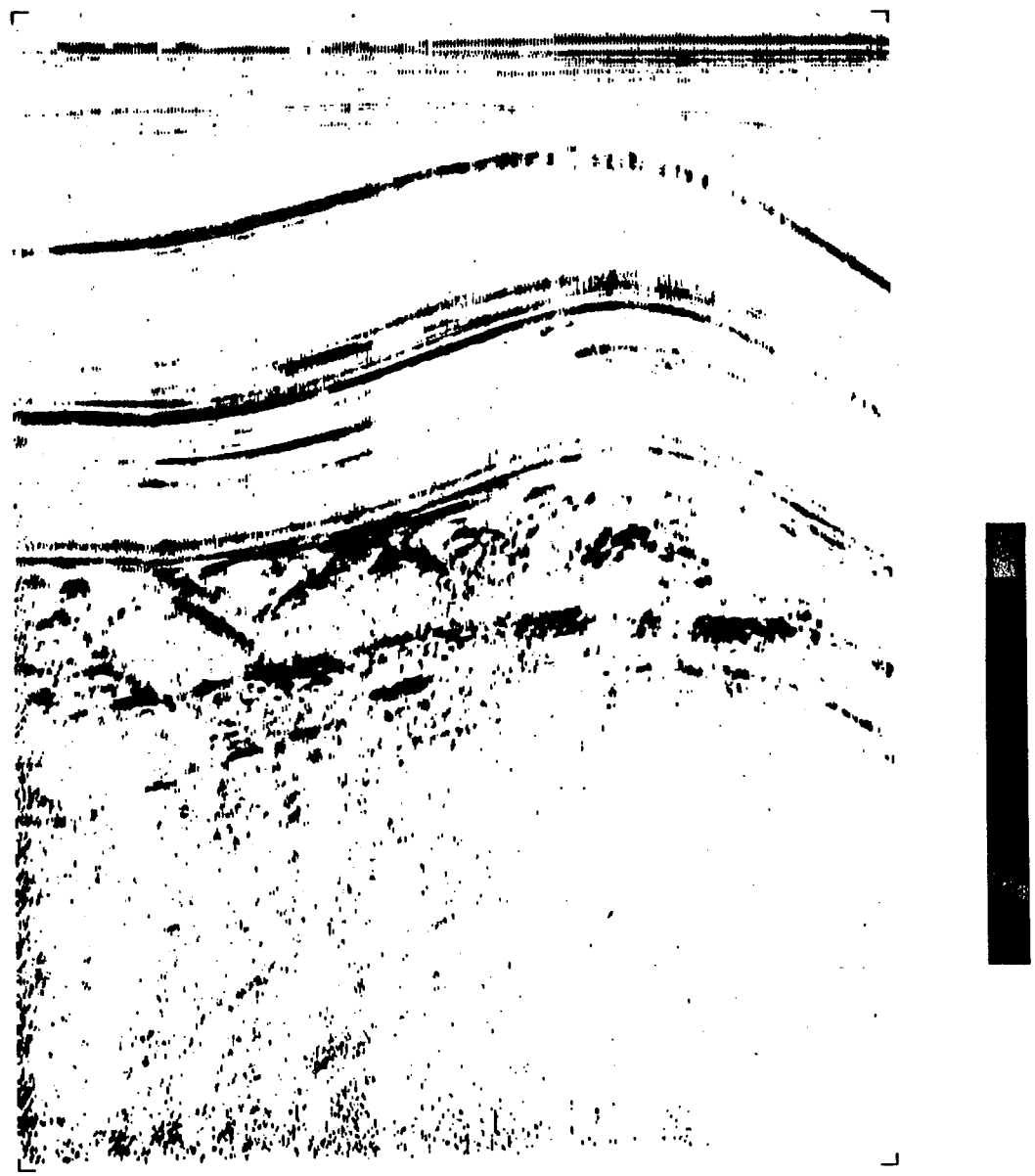
FIGS. 4A, 4B, 4C and 4D are sample color displays of a seismic section with a superimposed color modulation formed according to the present invention.
Figure 4B:
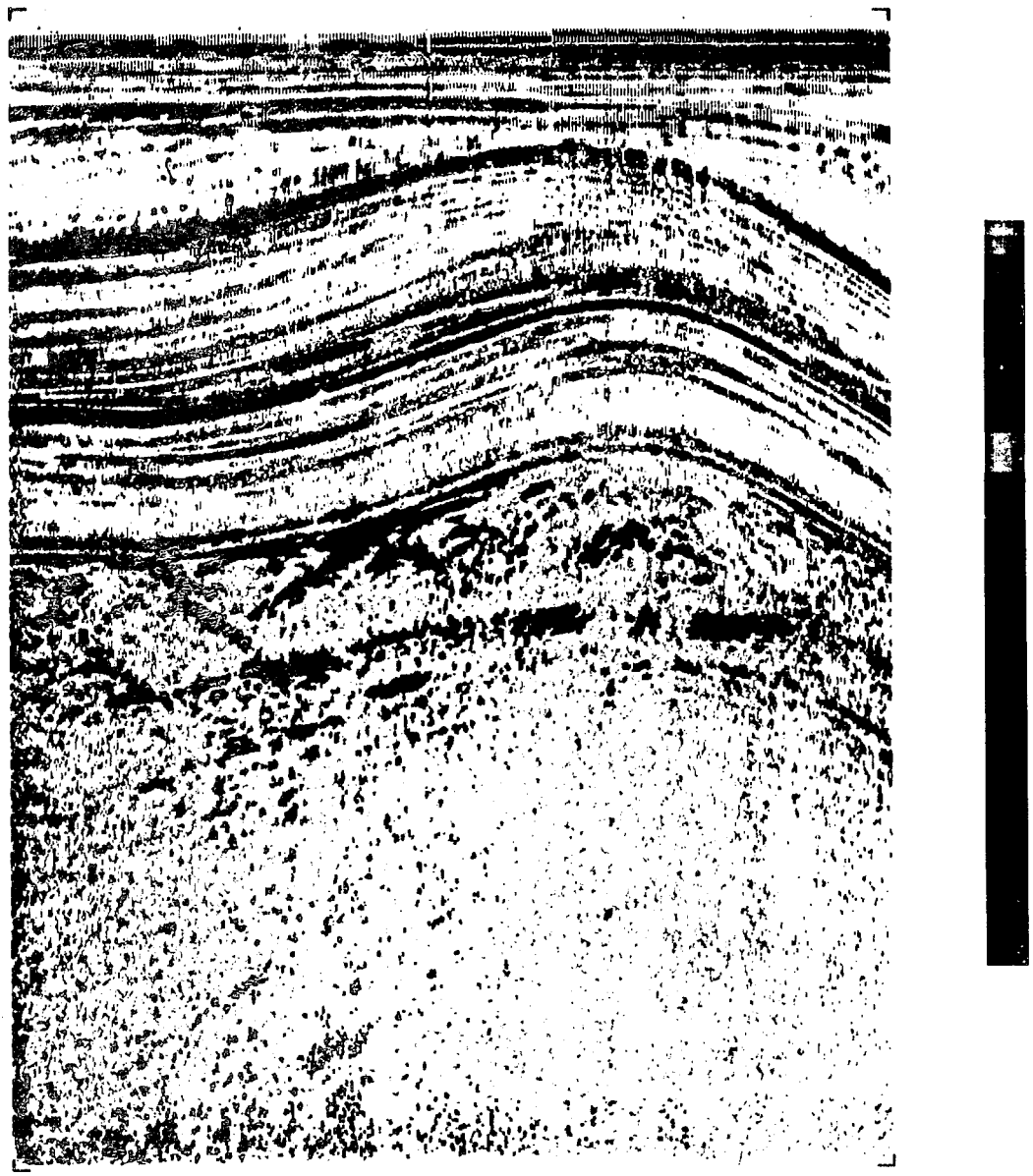
Figure 4C:
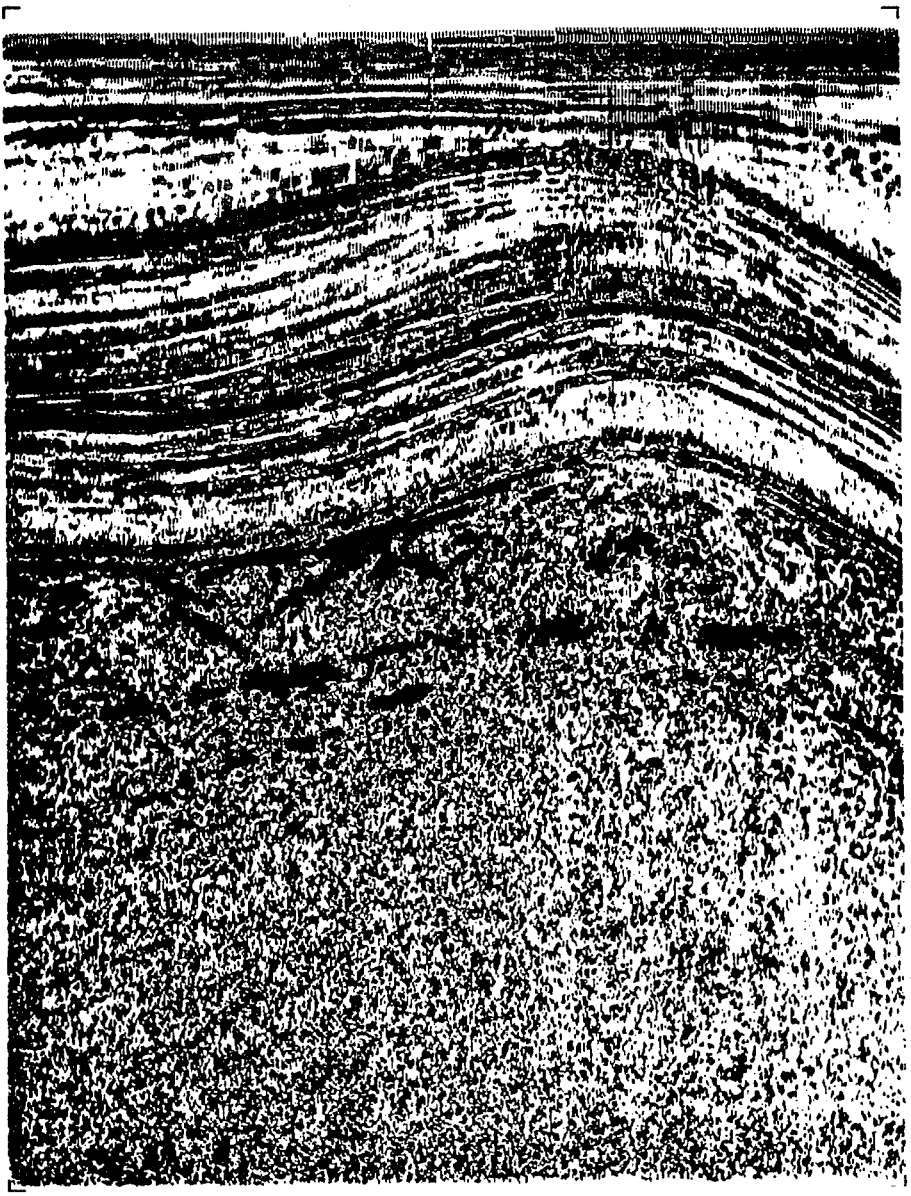
Figure 4C:
Figure 4D:
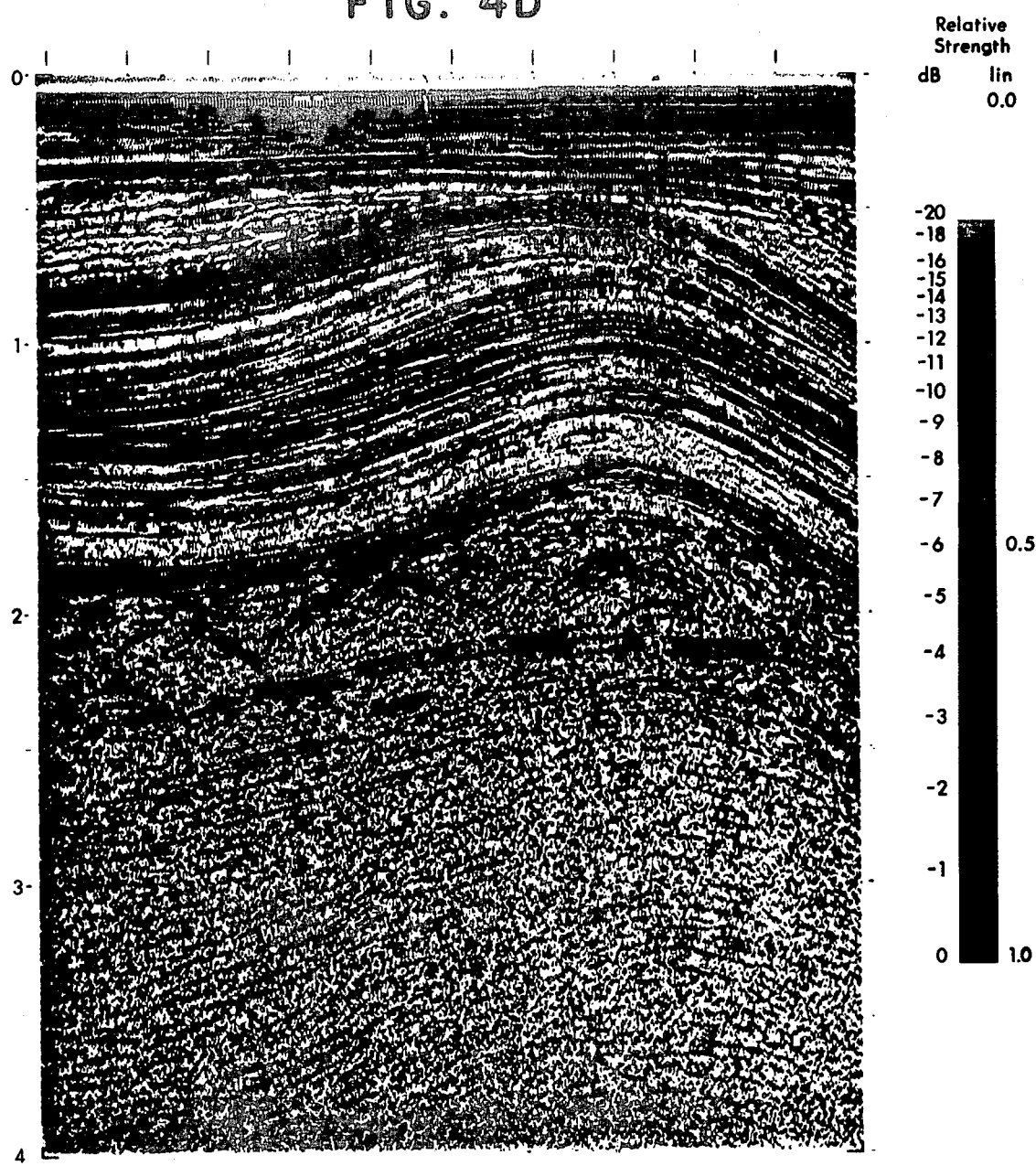
Figure 4E:
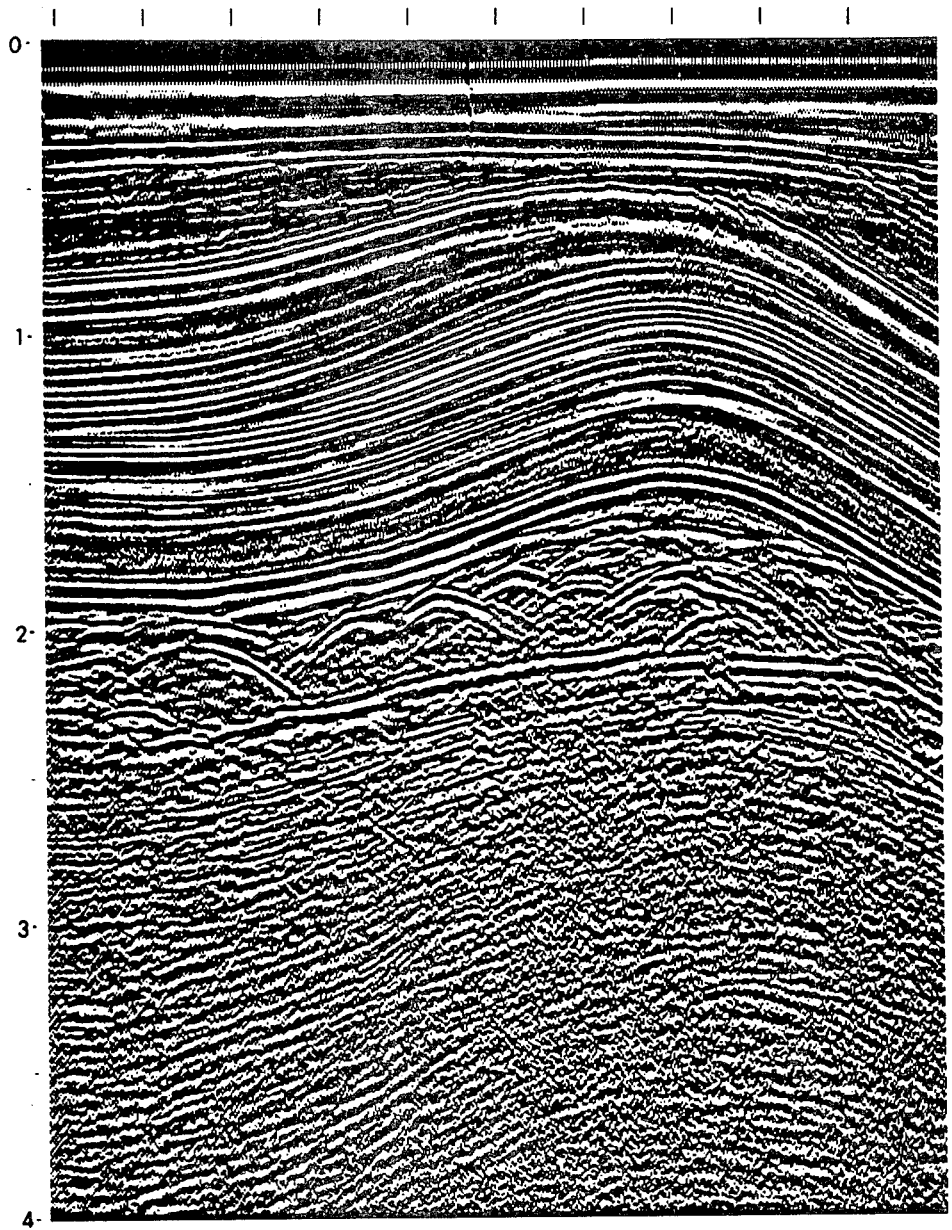
FIG. 4E is a conventional black-and-white display of the seismic section of FIGS. 4A through 4D without a superimposed color modulation.

FIG. 4D in the drawings represents an example display according to the present invention, in the form of an output display having an auxiliary seismic variable of reflection strength of a seismic signal superimposed as a color modulation on a black-and-white seismic section. The horizontal dimension across the display of FIG. 4D is distance along a seismic survey line as indicated by spacing lines, while the vertical dimension is seismic signal travel time, as indicated by seconds 0, 1, 2, 3 and 4 along the left edge of the display. A calibrated color key is formed therewith to permit numerical analysis of the assigned numerical values of the reflection strength function in the seismic data, as disclosed in the copending U.S. patent application Ser. No. 300,718 set forth above. The color key at the right in FIG. 4D, as is evident from inspection, indicates by color variations from magenta for maximum relative signal strength through shades of orange, yellow, green and blue calibrated numerical variations in the relative strength of the seismic signal which are superimposed as color modulations to increase the information content of the section for geophysical analysis as contrasted to the black-and-white display in FIG. 4E. Further, the depositing of the polymer coating in the form of small dots in the printer P for the various positive images increases the range of definition of the various colors so displayed, as will be more evident below.

FIGS. 4A, 4B, and 4C represent the final display of FIG. 4D during various steps of its formation in accordance with the present invention. FIG. 4A represents the display after a first positive image has been transferred into corresponding deposits of photopolymer emulsion thereon in the printer P and a magenta toner applied to adhere to the emulsion deposits.

As has been set forth above, the areas on the display where a high level of relative signal strength occurs are indicated by the magenta toner. The amounts of magenta deposited to form the calibrated color key, as is evident from FIG. 4A, decrease from a high density level as signal strength indicated by the key decreases.

After the magenta toner has been applied to adhere to the emulsion deposits and the emulsion permitted to harden, a new layer of photopolymer laminate 30 is applied thereabove, as indicated by a process step 118. A second positive image is superimposed thereabove and the display backing returned to the printer P for formation. For the second positive image to be transferred to the display backing, a second registry line 44 is used in order to prevent moire interference and superimposition of the positive images being deposited, as has been set forth. FIG. 4B represents the display of FIG. 4A after a second positive image has been transferred into corresponding deposits of emulsion during the step 112, the superimposed second positive image removed from the display backing and the laminate sheet removed during performance of the step 114, and a yellow color toner dust applied in the manner set forth above during the step 116.

As is evident from FIG. 4B, in areas of the display where moderately strong, but not maximum, levels of strength are present the dots of yellow toner and magenta toner blend to the eye to form ranges of colors in shades of umber, orange and yellow according to decreasing relative signal strength, both in the display and in the color key.

After the yellow toner has been applied during the step 116 to adhere to the emulsion deposits and the emulsion permitted to harden, a third layer of laminate is applied thereabove during the step 118, and a third positive image superimposed thereabove. The display backing is then returned to the printer P for formation of corresponding deposits of adhesive emulsion thereon in the printer P. After the emulsion is so deposited on the display backing, and the printer P stopped, the backing 28 is removed from the printer P and the superimposed positive image returned to storage. The upper cover sheet of the photopolymer laminate is then removed during the step 114 and a third color toner dust, cyan, is applied to adhere to the emulsion deposits resulting in the display of FIG. 4C.

As is evident from FIG. 4C, in areas of the display where relatively low levels of signal strength occur, the dots of yellow toner and the dots of cyan toner blend to the eye to form ranges of colors in shades of yellow-green, green, and blue according to decreasing relative signal strength both in the display and in the color key.

After the cyan toner has been applied in the manner set forth above and the deposited emulsion permitted to harden, a final layer of photopolymer laminate is applied to the display backing during step 118. A fourth positive image is superimposed thereabove and the display backing returned to the printer P for formation of corresponding deposits of emulsion thereon. After the printer P is stopped, the fourth positive image is removed therefrom, and the upper cover sheet of the photopolymer laminate is then removed so that a fourth color toner dust, black, is applied to adhere to the emulsion deposits, resulting in the final output display of FIG. 4D. The areas of the display to which the dots of black toner adhere and the size of the dots in these areas correspond to the areas of the black-and-white display of FIG. 4E, ranging from black through shades of gray to transparent.

Since at this time all four data signals from the tape T have been incorporated into the display, as schematically indicated by a step 120, the final output display is formed and the apparatus A is prepared for processing of subsequent displays. At this time the spacing lines across the top of the display, the travel time lines and designations, and the reference levels and designations of the color key are added, either by plotter, typing, lettering set, pen and ink, or lamination and superimposition of a previously printed transparency. An additional photopolymer laminate may thereafter be added and hardened in the printer P to protect the display so formed.

Thus, the present invention forms color displays readily and quickly from input data indicating in color the numerical variations in the data without requiring special purpose signal processing equipment. Further, as has been set forth above, the positive image transparencies are also not altered and are thus available for further use. Should a processing error occur, such as application of a wrong color of toner to an emulsion, with the present invention it is not required to plot a new set of data and subsequently form positive images in order to correct the processing error. A new display backing is laminated, and the first positive image inserted therewith into the printer P for formation of the first positive image and processing in accordance with the present invention continues.

It should be understood that the printer P of the present invention may further be used to make color displays from film negatives, if desired, when such negatives are produced from the seismic data in accordance with the copending U.S. patent application No. 300,718. Such negatives are then screened to produce screened positives in the conventional manner and the laminates are exposed to ultraviolet light in the printer P through the screened positives to deposit gummy areas thereon so that toner may be applied. In this case, the screen 26 is not used.

It should further be understood that negatives could, if desired, be plotted in the plotter P and positives developed therefrom for use with the present invention.

The foregoing disclosure and description of the invention are illustrative and explanatory thereof, and various changes in the size, shape, and materials as well as in the details of the illustrated construction may be made without departing from the spirit of the invention.

We claim:

1. In forming color graphic displays directly from a sequence of input digital data values, wherein differing colors at data display points in the color displays are quantitatively indicative of differing values or ranges of values of the digital data, and processed input digital data to be displayed at the data display points have numerical codes assigned thereto from an assignment table, with the assignment table comprised of a set of numerical codes referenced as a two-dimensional matrix, one dimension of the matrix representing sample values of the data to be displayed, each sample value representing an assigned range from a plurality of ranges into which the input data values are partitioned, and the other dimension of the matrix representing a plurality of component displays, one component display for each component color in the color displays to be formed, and further with the numerical codes of the set specifying the visual image densities to be formed at data display points of the component displays and further specifying the relative density of each component color in the colors associated with such data display points according to the sample values thereof, and further with the numerical codes assigned to the data display points organized into output sequences for each of the component displays, improved apparatus for forming a component color display for each output sequence, comprising:
   a. means for plotting the output sequences onto corresponding film transparencies;
   b. means for forming a positive image for each of the plotted output sequences whose image densities vary according to the numerical codes of such output sequence; and
   c. means for depositing a polymer coating on a display surface according to the image densities of the positive image for each of the plotted output sequences wherein a color toner may be applied to form a component color display.

2. The structure of claim 1, wherein the polymer coatings for the component displays are sequentially deposited on the display surface and color toner is applied thereto before the next polymer coating is deposited, and said means for depositing comprises:
  a. means for exposing the polymer coatings to ultraviolet light;
  b. means for screening the ultraviolet light with the positive images wherein the amount of the coatings deposited is controlled by the opacity of the positive images; and
  c. means for angle screening the ultraviolet light for each of the polymer coatings to be exposed wherein the coatings deposited are prevented from forming interference patterns with each other.

3. The structure of claim 1, further including: means for laminating a polymer emulsion on the display surface so that a polymer coating may be deposited thereon by said means for depositing.

4. The structure of claim 1, wherein said means for depositing comprises:
  a. means for exposing the polymer coatings to ultraviolet light;
  b. means for screening the ultraviolet light with the positive images wherein the amount of the coatings deposited is controlled by the opacity of the positive images.

* * * * *